United States Patent
Zhou et al.

(10) Patent No.: US 9,917,044 B2
(45) Date of Patent: Mar. 13, 2018

(54) PACKAGE WITH BI-LAYERED DIELECTRIC STRUCTURE

(71) Applicant: INTEL CORPORATION, Santa Clara, CA (US)

(72) Inventors: Zheng Zhou, Chandler, AZ (US); Mihir K. Roy, Chandler, AZ (US); Chong Zhang, Chandler, AZ (US); Kyu-Oh Lee, Chandler, AZ (US); Amanda E. Schuckman, Scottsdale, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/028,278

(22) PCT Filed: May 13, 2015

(86) PCT No.: PCT/US2015/030649
§ 371 (c)(1),
(2) Date: Apr. 8, 2016

(87) PCT Pub. No.: WO2016/182571
PCT Pub. Date: Nov. 17, 2016

(65) Prior Publication Data
US 2017/0103941 A1    Apr. 13, 2017

(51) Int. Cl.
*H01L 23/52*     (2006.01)
*H01L 23/498*    (2006.01)
(Continued)

(52) U.S. Cl.
CPC .. *H01L 23/49827* (2013.01); *H01L 21/76804* (2013.01); *H01L 21/76879* (2013.01); *H01L 23/49838* (2013.01); *H01L 24/14* (2013.01)

(58) Field of Classification Search
CPC ....... H01L 2924/00014; H01L 2924/00; H01L 2924/12042; H01L 2224/16225;
(Continued)

(56) References Cited

U.S. PATENT DOCUMENTS

| 2006/0028305 A1* | 2/2006 | Dutta ..................... H01P 3/084 333/238 |
| 2009/0051469 A1* | 2/2009 | Jow ......................... H01G 4/30 333/247 |

(Continued)

OTHER PUBLICATIONS

International Search Report and Written Opinion dated Feb. 12, 2016 for International Application No. PCT/US2015/030649, 11 pages.

*Primary Examiner* — Robert Bachner
(74) *Attorney, Agent, or Firm* — Schwabe, Williamson & Wyatt, P.C.

(57) ABSTRACT

Some embodiments of the present disclosure describe a multi-layer package with a bi-layered dielectric structure and associated techniques and configurations. In one embodiment, an integrated circuit (IC) package assembly includes a dielectric structure coupled with a metal layer, with the dielectric structure including a first dielectric layer and a second dielectric layer, wherein the first dielectric layer has a thickness less than a thickness of the second dielectric layer and a dielectric loss tangent greater than a dielectric loss tangent of the second layer. Other embodiments may be described and/or claimed.

25 Claims, 7 Drawing Sheets

(51) Int. Cl.
*H01L 23/00* (2006.01)
*H01L 21/768* (2006.01)

(58) Field of Classification Search
CPC . H01L 2224/73204; H01L 2224/32225; H01L 2224/81815; H01L 23/49827; H01L 24/16; H01L 23/49822; H01L 2924/0002; H01L 2924/014

See application file for complete search history.

(56) References Cited

U.S. PATENT DOCUMENTS

| | | | |
|---|---|---|---|
| 2009/0056983 A1* | 3/2009 | Liu | H05K 1/0245 174/255 |
| 2009/0211792 A1* | 8/2009 | Abrahamson | H05K 1/024 174/259 |
| 2012/0205141 A1 | 8/2012 | Ogawa et al. | |

* cited by examiner

PACKAGE WITH BI-LAYERED DIELECTRIC STRUCTURE

CROSS REFERENCE TO RELATED APPLICATIONS

The present application is a national phase entry under 35 U.S.C. § 371 of International Application No. PCT/US2015/030649, filed May 13, 2015, entitled "PACKAGE WITH BI-LAYERED DIELECTRIC STRUCTURE." The Specification of the PCT/US2015/030649 Application is hereby incorporated by reference.

FIELD

Embodiments of the present disclosure generally relate to the field of materials for integrated circuit (IC) assemblies, and more particularly, to a multi-layer package.

BACKGROUND

In order to maintain signal integrity with integrated circuits using high frequency transmission, some integrated circuits use electronic substrate dielectric materials with low dielectric loss. However, low dielectric loss material tends to be more resistant to laser drilling of vias and to desmearing of residue or debris. Previous approaches to addressing these issues have typically required new equipment investment or greatly reduced substrate processing throughput.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Some embodiments of the present disclosure describe a multi-layer package with a bi-layered dielectric structure and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
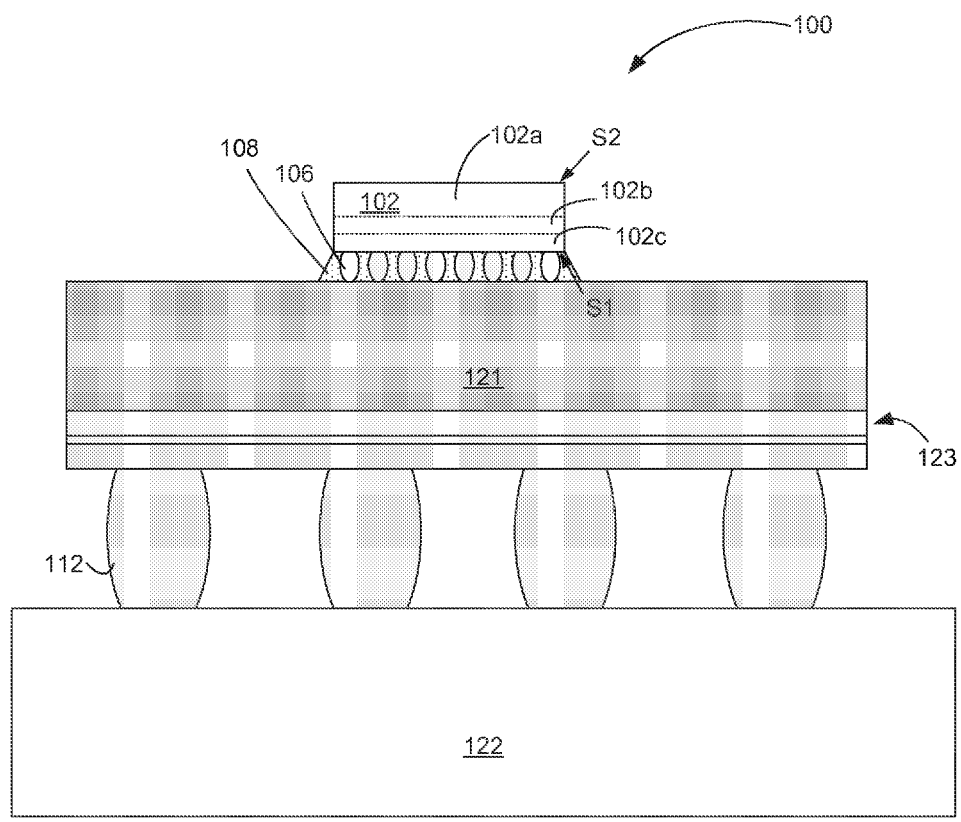
FIG. 1 schematically illustrates a cross-section side view of an example integrated circuit (IC) assembly, in accordance with some embodiments.

FIG. 1 schematically illustrates a cross-section side view of an example integrated circuit (IC) assembly 100, in accordance with some embodiments. In some embodiments, the IC assembly 100 may include one or more dies (hereinafter "die 102") electrically and/or physically coupled with a package assembly 121 (sometimes referred to as a "package substrate"). In some embodiments, the package assembly 121 may be electrically coupled with a circuit board 122.

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a radio frequency (RF) die. In other embodiments, the die may be, include, or be a part of a processor, memory, system-on-chip (SoC), or ASIC.

In some embodiments, an underfill material 108 (sometimes referred to as an "encapsulant") may be disposed between the die 102 and the package assembly 121 to promote adhesion and/or protect features of the die 102 and the package assembly 121. The underfill material 108 may be composed of an electrically insulative material and may encapsulate at least a portion of the die 102 and/or the die-level interconnect structures 106. In some embodiments, the underfill material 108 may be in direct contact with the die-level interconnect structures 106.

The die 102 can be attached to the package assembly 121 according to a wide variety of suitable configurations including, for example, being directly coupled with package assembly 121 in a flip-chip configuration, as depicted. In the flip-chip configuration, an active side, S1, of the die 102 including active circuitry is attached to surface of the package assembly 121 using die-level interconnect structures 106 such as bumps, pillars, or other suitable structures that may also electrically couple the die 102 with the package assembly 121. The active side S1 of the die 102 may include transistor devices, and an inactive side, S2, may be disposed opposite to the active side S1.

The die 102 may generally include a semiconductor substrate 102a, one or more device layers (hereinafter "device layer 102b"), and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate 102a. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vias to provide electrical routing and/or contacts.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package assembly 121 may include a multi-layer package assembly with integrated components for wireless communication. The wireless communication may include, for example, short range wireless data transfer between portable devices and/or wireless displays or high speed wireless communication between peer devices. In some embodiments, the package assembly 121 may include one or more bi-layer dielectric structures 123. For example, in some embodiments, the package assembly 121 may be a multi-layer package assembly including one or more bi-layer dielectric structures as described in connection with FIGS. 2-9.

The package assembly 121 may include electrical routing features (not shown in FIG. 1) such as, for example, traces, pads, through-holes, vias, or lines configured to route electrical signals to or from the die 102. For example, the package assembly 121 may be configured to route electrical signals between the die 102 and components for wireless communication that are integrated within the package assembly, or between the die 102 and the circuit board 122, or between the die 102 and another electrical component (e.g., another die, interposer, interface, component for wireless communication, etc.) coupled with the package assembly 121.

The circuit board 122 may be a printed circuit board (PCB) composed of an electrically insulative material such as an epoxy laminate. For example, the circuit board 122 may include electrically insulating layers composed of materials, such as polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. Interconnect structures (not shown) such as traces, trenches or vias may be formed through the electrically insulating layers to route the electrical signals of the die 102 through the circuit board 122. The circuit board 122 may be composed of other suitable materials in other embodiments. In some embodiments, the circuit board 122 may be a motherboard or other PCB in a computing device (e.g., PCB 942 of FIG. 9).

Package-level interconnects, such as solder balls 112, may be coupled with the package assembly 121 and/or the circuit board 122 to form corresponding solder, joints that are configured to further route the electrical signals between the package assembly 121 and the circuit board 122. Other suitable techniques to physically and/or electrically couple the package assembly 121 with the circuit board 122 may be used in other embodiments.

The IC assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

Figure 2:
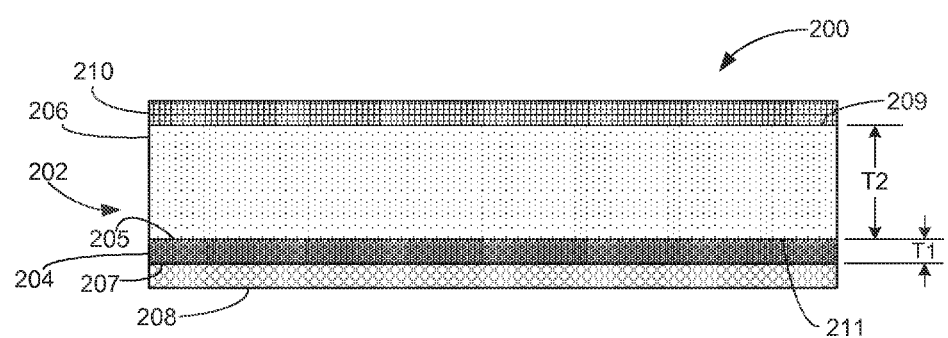
FIG. 2 schematically illustrates a cross-section side view of a dielectric structure. in accordance with some embodiments.

FIG. 2 schematically illustrates a cross-section side view of a dielectric film structure 200, in accordance with some embodiments. According to various embodiments, the dielectric film structure 200 may include a dielectric structure 202 that may be a bi-layered dielectric structure having a first dielectric layer 204 and a second dielectric layer 206. In some embodiments, the first dielectric layer 204 may be referred to as a bottom layer and the second dielectric layer 206 may be referred to as a top layer of the dielectric structure 202. A sacrificial cover film 208 may cover the first dielectric layer 204 and a carrier film 210 may be coupled with the second dielectric layer 206 in various embodiments. The sacrificial cover film 208 may be formed of a material such as polypropylene (PP), and the carrier film 210 may be formed of a material such as polyester (e.g., polyethylene terephthalate (PET)) in various embodiments. The first dielectric layer 204 and the second dielectric layer 206 may be buildup materials in various embodiments.

The first dielectric layer 204 has a first side 205 and a second side 207 opposite to the first side, with a distance between the first and second sides of the first dielectric layer 204 defining a first thickness, T1. The second dielectric layer 206 has a first side 209 and a second side 211 opposite to the first side, with a distance between the first and second sides of the second dielectric layer 206 defining a second thickness, T2. In some embodiments, the first side 205 of the first dielectric layer 204 is coupled with the second side 211 of the second dielectric layer 206. The first thickness, T1, of the first dielectric layer 204 may be approximately 3 microns (micrometers) in various embodiments. The first thickness, T1, may be less than or equal to 5 microns in various embodiments and may range from greater than or equal to I micron to less than or equal to 5 microns in some embodiments. The second thickness, T2, of the second dielectric layer 206 may be greater than 7 microns in some embodiments. In some embodiments, the first thickness T1 or the second thickness T2 may differ from these values or ranges.

In some embodiments, the second dielectric layer 206 may be a low loss dielectric layer having a dielectric loss tangent less than 0.003 for operation in a frequency range from greater than or equal to 1 gigahertz to less than or equal to 50 gigahertz. The second dielectric layer 206 may have a dielectric constant k in a range from greater than or equal to 2 to less than or equal to 8 for operation in a frequency range from greater than or equal to 1 gigahertz to less than or equal to 50 gigahertz in various embodiments. The first dielectric layer 204 may be a dielectric layer having a dielectric loss tangent greater than 0.005 for operation in a frequency range from greater than or equal to 1 gigahertz to less than or equal to 50 gigahertz. The first dielectric layer 204 may have a dielectric constant k in a range from greater than or equal to 2 to less than or equal to 8 for operation in a frequency range from greater than or equal to 1 gigahertz to less than or equal to 50 gigahertz in various embodiments. In some embodiments, the dielectric loss tangent may be determined using a cavity perturbation method.

In some embodiments, the first dielectric layer 204 may be formed of a first type of polymer or oligomer, or may be formed of a first mixture having one or more polymers and/or one or more oligomers. In some embodiments, the second dielectric layer 206 may be formed of a second type of polymer or oligomer, or may be formed of a second mixture having one or more polymers and/or one or more oligomers. In some embodiments, the polymer(s) and/or oligomer(s) of the first dielectric layer 204 are formed of a first set of molecules and the polymer(s) and/or oligomer(s) of the second dielectric layer 206 are formed of a second set of molecules. In some embodiments, the first dielectric layer 204 may be formed of a more polar material than the second dielectric layer 206. In some embodiments, molecules in the first set of molecules may have a greater electric molecular dipole moment than molecules in the second set of molecules. In some embodiments, the molecules in the first and/or second set of molecules may be individual monomer molecules of polymers and/or oligomers. The first dielectric layer 204 may be formed of amide, acid, or alcohol based polymers and the second dielectric layer 206 may be formed of ester, olefin, ether, phenylene, or phenylene oxide based polymers, for example. In some embodiments, the first dielectric layer 204 may be formed of polyvinylalcohol or polyamide and the second dielectric layer 206 may be formed of polyolefin, polyimide, or polyphenylene oxide, for example. In some embodiments, the greater polarity of the first dielectric layer 204 may facilitate resin or debris removal during a desmearing process. In some embodiments, the first dielectric layer 204 in combination with the second dielectric layer 206 may provide increased absorption of energy during a laser drilling process in comparison to a monolayered low loss dielectric structure, decreasing the time or energy needed for creation of micro via openings in the dielectric structure 202. In some embodiments, the thinner first thickness, T1, of the first dielectric layer 204 in relation to the second thickness, T2, of the second dielectric layer 206 may maintain desirable overall electrical performance and dielectric loss characteristics of the dielectric structure 202.

Figure 6:
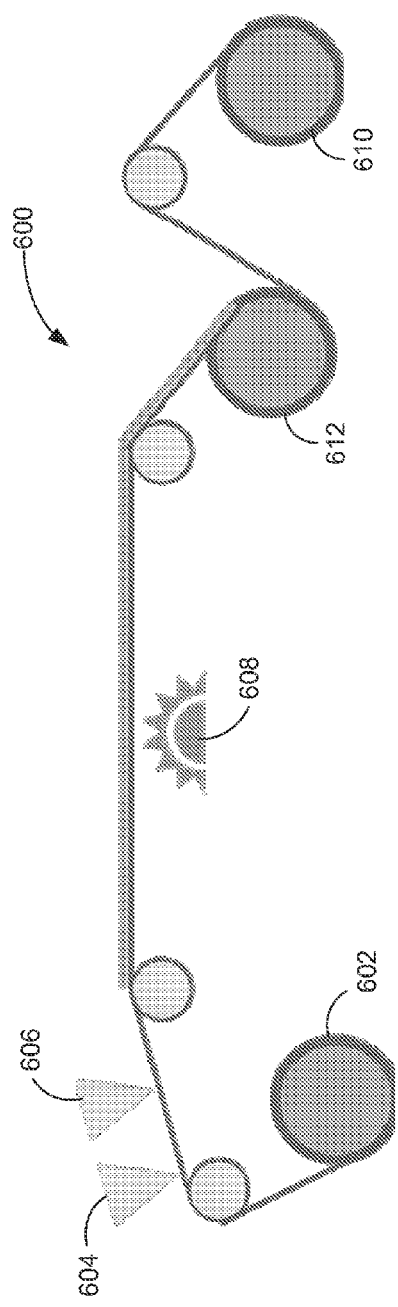
FIG. 6 schematically illustrates a simultaneous coating system for fabricating a dielectric film structure, in accordance with some embodiments.
Figure 7:
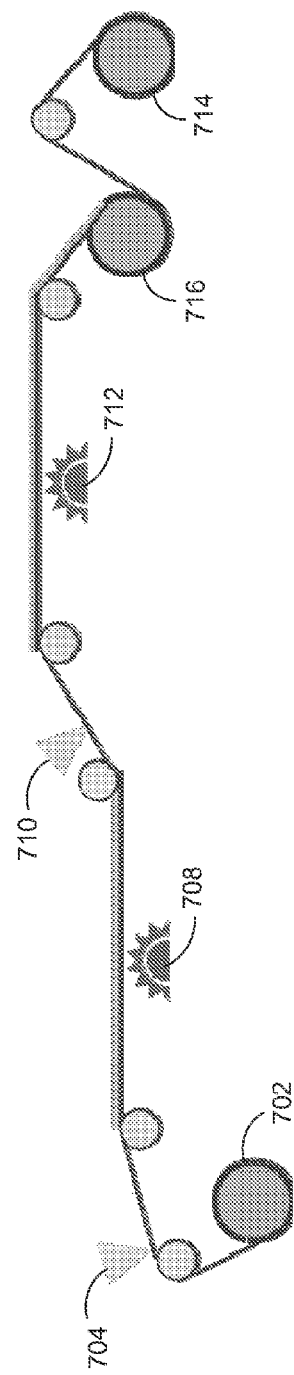
FIG. 7 schematically illustrates a tandem coating system for fabricating a dielectric film structure, in accordance with some embodiments.
Figure 8:
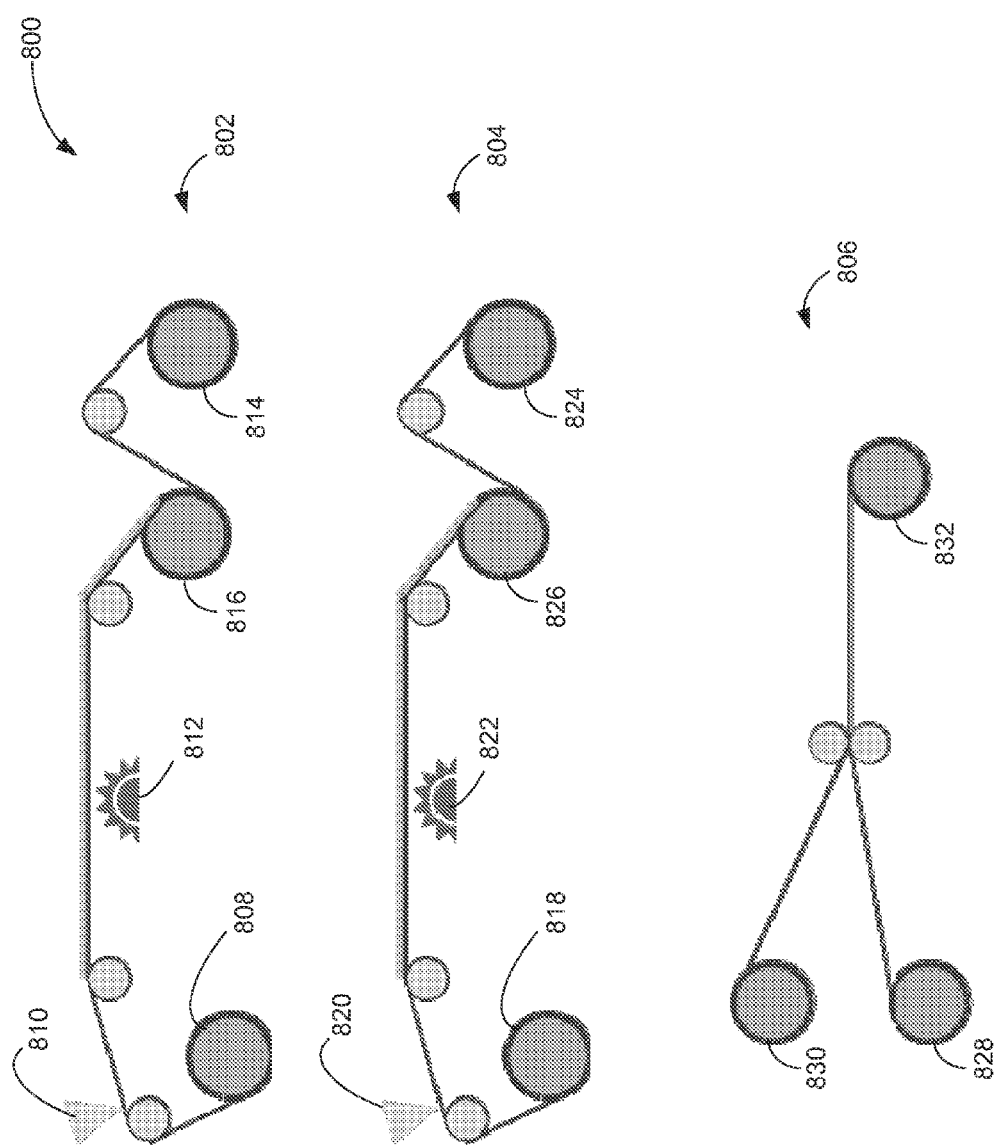
FIG. 8 schematically illustrates a lamination system for fabricating a dielectric film structure, in accordance with some embodiments.

In some embodiments, the dielectric film structure 200 may be fabricated using a variety of systems and methods, such as by using a simultaneous coating system, a tandem coating system, or a lamination system such as those described with respect to FIGS. 6-8.

Figure 3:
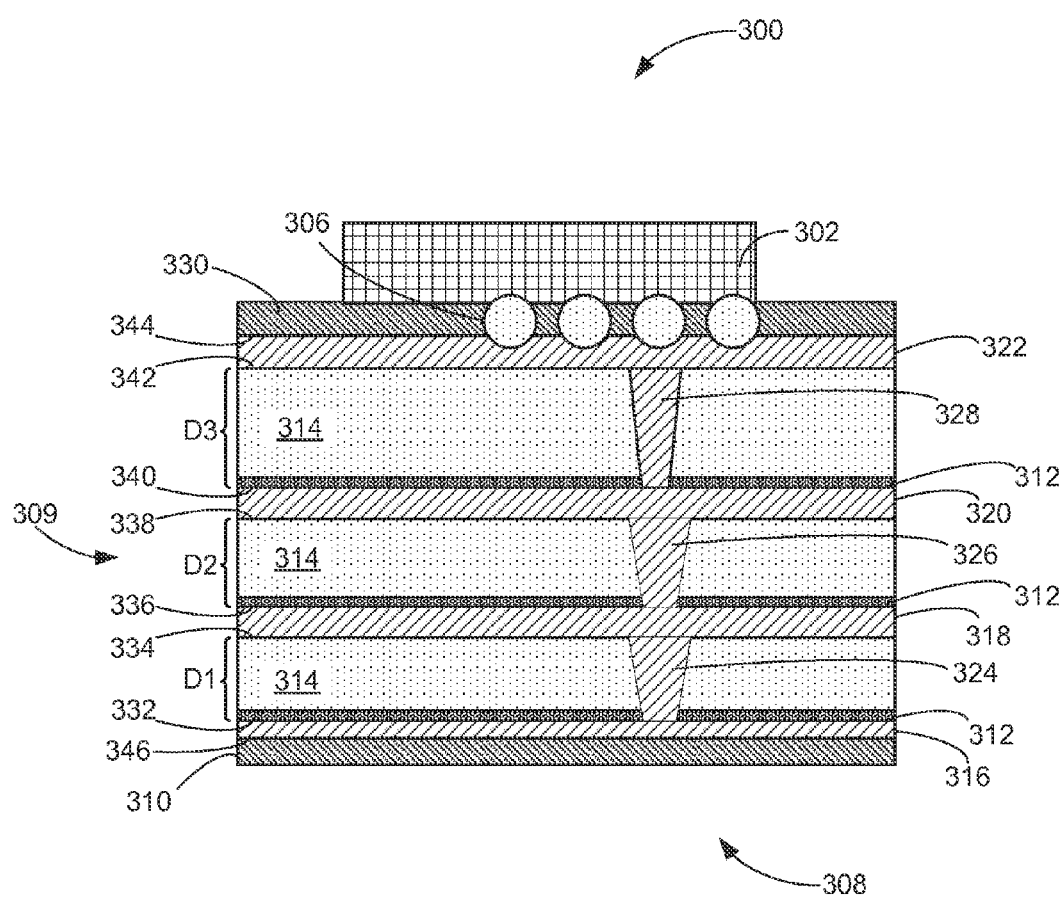
FIG. 3 schematically illustrates a cross-section side view of a multi-layer package assembly coupled with a die, in accordance with some embodiments.

FIG. 3 schematically illustrates a cross-section side view of an IC assembly 300 including a package assembly 308 coupled with a die 302, in accordance with various embodiments. In some embodiments, interconnect structures 306 may couple the die 302 with the package assembly 308. The package assembly 308 may be an example implementation of the package assembly 121 described with respect to FIG. 1. In some embodiments, the package assembly 308 may be a multi-layer package assembly that includes a plurality of dielectric structures 309 indicated as D1, D2, and D3. The dielectric structures 309 may be bi-layer dielectric structures such as the dielectric structure 202 described with respect to FIG. 2. The dielectric structures 309 may each include a first dielectric layer 312 that may be formed as described with respect to the first dielectric layer 204, and a second dielectric layer 314 that may be formed as described with respect to the second dielectric layer 206, in various embodiments.

In various embodiments, the package assembly 308 may include one or more solder mask layers 310, 330 formed on an outermost surface of the package assembly 308. The one or more solder mask layers 310, 330 may have openings to allow formation of electrical connections (e.g., solder bumps, pillars, or balls) between pads coupled with electrically conductive features of the package assembly 308 such as lines of a first metal layer 316 and/or a fourth metal layer 322. The pads may be configured to receive, for example, a die (e.g., die 102 of FIG. 1) or other electrical assembly. In some embodiments, the one or more solder mask layers 310, 330 may be composed of a low loss dielectric material such as liquid crystal polymer (LCP) or like material to reduce losses at a frequency of wireless communication of the package assembly. In some embodiments, the one or more solder mask layers 310, 330 may each have a thickness of about 25 microns. The one or more solder mask layers 310, 330 may have other suitable thicknesses and/or may be composed of other suitable materials in other embodiments, such as solder resist materials. In some embodiments, one or more of the solder mask layers 310, 330 may be formed of a bi-layer dielectric structure such as that described with respect to FIG. 2.

In some embodiments, the first dielectric layer 312 of the dielectric structure D1 may be coupled with a first side 332 of the first metal layer 316 and the second dielectric layer 314 of the dielectric structure D1 may be coupled with a first side 334 of a second metal layer 318. A second side 336 of the second metal layer 318 may be coupled with the first dielectric layer 312 of the second dielectric structure D2 and a first side 338 of a third metal layer 320 may be coupled with the second dielectric layer 314 of the dielectric structure 172. A second side 340 of the third metal layer 320 may be coupled with the first dielectric layer 312 of the dielectric structure D3 and a first side 342 of the fourth metal layer 322 may be coupled with the second dielectric layer 314 of the dielectric structure D3. A second side 344 of the fourth metal layer 322 may be coupled with the solder mask layer 330 and a second side 346 of the first metal layer 316 may be coupled with the solder mask layer 310. In some embodiments, one or more of the first metal layer 316, the second metal layer 318, the third metal layer 320, or the fourth metal layer 322 may provide an antenna layer and/or routing for low frequency (LF) signals, such as power delivery, control signals, clock signals, reset signals, and the like. In some embodiments, one or more of the metal layers may provide a radio frequency (RF) ground plane or route RF signals.

In some embodiments, a first via 324 extends through the dielectric structure DI such that at least a portion of the first metal layer 316 may be electrically coupled with at least a portion of the second metal layer 318. A second via 326 may extend through the dielectric structure D2 such that at least a portion of the second metal layer 318 may be electrically coupled with at least a portion of the third metal layer 320 in various embodiments. A third via 328 may extend through the dielectric structure D3 such that at least a portion of the third metal layer 320 may be electrically coupled with at least a portion of the fourth metal layer 322 in various embodiments. In some embodiments, the interconnects 306 may be coupled with the die 302 and the fourth metal layer 322. In some embodiments, the third via 328 may be electrically coupled with one or more of the interconnects 306. In some embodiments, one or more of the first via 324, the second via. 326, or the third via 328 may be a micro-via having a maximum diameter of less than or equal to 150 microns.

In some embodiments, more or fewer dielectric structures 309, metal layers, solder mask layers, interconnect structures, or vias may be used.

Figure 4:
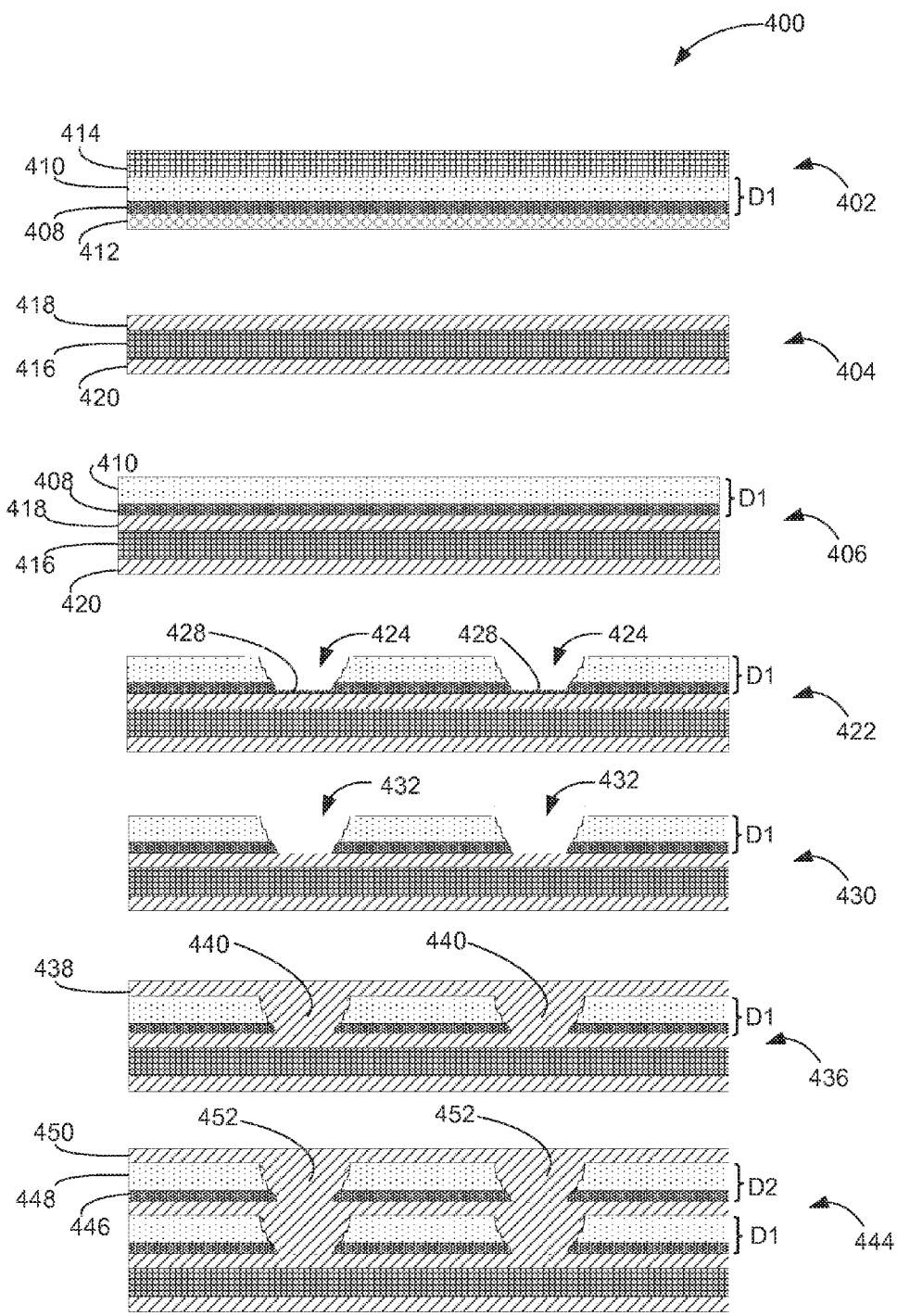
FIG. 4 schematically illustrates a cross-section side view of a multi-layer package assembly during various stages of fabrication, in accordance with some embodiments.

FIG. 4 schematically illustrates a cross-section side view of a multi-layer package assembly 400 during various stages of fabrication, in accordance with various embodiments. A dielectric film structure 402 may be coupled with a metal-covered core 404 to produce a multi-layer package assembly 406. in some embodiments, the dielectric film structure 402 may take the form of the dielectric film structure 200 described with respect to FIG. 2. The dielectric film structure 402 may include a bi-layered dielectric structure DI having a first dielectric layer 408 and a second dielectric layer 410. The dielectric structure DI may be structured in a manner such as that described with respect to the dielectric structure 202 of FIG. 2, for example. In some embodiments, the dielectric film structure 402 may also include a sacrificial cover film covering the first dielectric layer 408 and a carrier film 414 coupled with the second dielectric layer 410. The metal-covered core 404 may include a core 416 coupled with a first metal layer 418. In some embodiments, the core 416 may also be coupled with an additional metal layer 420. The core 416 may be formed of a core-like material having low loss dielectric properties such as, for example, a prepreg material or liquid crystal polymer (LCP) derivative such as LCP with glass (e.g., filler, cloth, fibers, etc.), polyether ether ketone (PEEK), or build-up layer material such as an epoxy-based material of an Ajinomoto Build-up Film (ABF), which may be reinforced with other strengthening materials in some embodiments.

In some embodiments, the sacrificial cover film 412 may be removed and the first dielectric layer 408 may be coupled with the first metal layer 418 to yield the multi-layer package assembly 406 after the carrier film 414 is removed. In some embodiments, the multi-layer package assembly 400 may be a coreless package assembly, with the core 416 and the additional metal layer 420 not being present and the first dielectric layer 408 coupled with a metal layer such as the first metal layer 418.

In some embodiments, first level via openings 424 may be formed by drilling holes through the bi-layered dielectric structure D1 using a laser drilling process to yield a multi-layer package assembly 422. Residue 428 will typically remain in the first level via openings 424. The residue 428 may include resin or debris mainly from the first dielectric layer 408, for example. A desmearing process may be used to remove the residue 428 to yield a multi-layer package assembly 430. The multi-layer package assembly 430 may now include desmeared first level via openings 432 such that a portion of the first metal layer 418 may be exposed at the bottom of the desmeared first level via openings 432. A plating process may be used to deposit a metal such as copper into the desmeared first level via openings 432 to form a second metal layer 438 and first level vias 440 to yield a multi-layer package assembly 436.

In some embodiments, additional layers may be added to the multi-layer package assembly 400 such as by coupling a second bi-layer dielectric structure D2 to the second metal layer 438 followed by forming of second level via openings, desmearing the second level via openings, and performing a metal plating process to yield a multi-layer package assembly 444. In some embodiments, the second bi-layer dielectric structure D2 may include a first dielectric layer 446 coupled with a second dielectric layer 448 that may be structured in a similar manner to the first dielectric layer 204 and the second dielectric layer 206, respectively. A plating process may be used to give a third metal layer 450 and second level vias 452 in various embodiments. The multi-layer package assembly 444 may be coupled with a die such as the die 102 described with respect to FIG. 1 using any suitable techniques such as using die-level interconnects such as bumps or pillars to electrically couple the die with the multi-layer package assembly 444.

Figure 5:
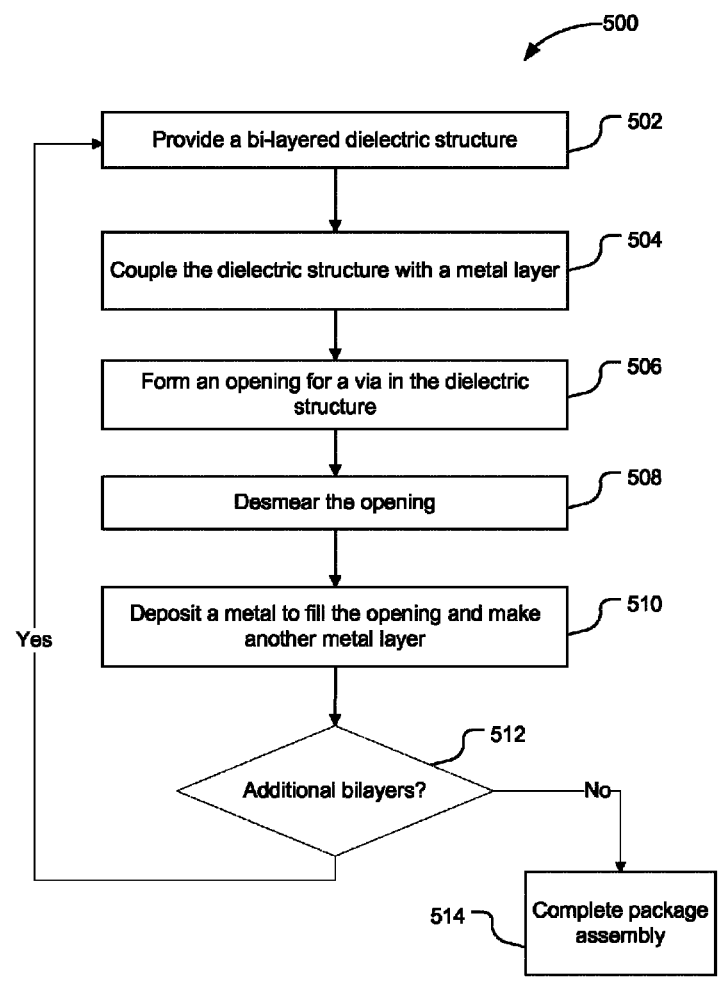
FIG. 5 schematically illustrates a flow diagram for a method of fabricating a multi-layer package assembly, in accordance with some embodiments.

FIG. 5 schematically illustrates a flow diagram for a method 500 of fabricating a multi-layer package assembly (e.g., the package assembly 308 of FIG. 3 or the multi-layer package assembly 444 of FIG. 4), in accordance with various embodiments. The method 500 may comport with techniques described in connection with FIGS. 2-3 and vice versa.

At a block 502, a bi-layer dielectric structure may be provided. The bi-layer dielectric structure may be a dielectric structure such as the dielectric structure 202 described with respect to FIG. 2. At a block 504, the dielectric structure may be coupled with a metal layer. The dielectric structure may be coupled with the first metal layer 418 of the metal covered core 404 as described with respect to FIG. 4, for example. At a block 506, an opening for a via may be formed in the dielectric structure. In some embodiments, the opening may be for a micro-via formed by a $CO_2$ laser drilling process, for example. Other processes may be used to create the opening in various embodiments. At a block 508, the opening may be desmeared. At a block 510, a metal may be deposited to fill the opening. In some embodiments, the metal may be deposited in a plating process that may also create another metal layer. At a decision block 512, it may be determined whether additional dielectric bilayers are to be added to the multi-layer package assembly. If at the decision block 512, it is determined that additional dielectric bilayers are to be added, the method 500 may return to the block 502. If, at the decision block 512, it is determined that no additional dielectric bilayers are to be added, the method 500 may continue to a block 514 where the multi-layer package assembly may be completed or further fabrication operations performed.

In some embodiments, various processes may be performed at the block 514. For example, solder mask layers may be formed on one or more outer layers of the multi-layer package assembly, pads may be formed on an outer metal layer, openings may be formed to expose the pads, a surface finishing process such as a gold surface finishing process may be performed, and/or one or more dies may be coupled with the multilayer package assembly such as by using the pads, in some embodiments.

FIG. 6 schematically illustrates a simultaneous coating system 600 for fabricating a dielectric film structure such as the dielectric film structure 200 described with respect to FIG. 2, in accordance with various embodiments. The simultaneous coating system 600 may include a carrier film roll 602 that may hold a polyester (e.g., PET) carrier film, for example. The carrier film may be routed past a first coat head 604 that may deposit a low loss dielectric layer such as the second dielectric layer 206 on the carrier film. The carrier film may then be routed past a second coat head 606 that may deposit a dielectric layer engineered for laser drilling and smear removal, such as the first dielectric layer 204, onto the low loss dielectric layer. The carrier film with the two deposited dielectric layers may then be routed past a dryer 608 to dry the dielectric layers together and bond them to the carrier film. The dried dielectric layers and carrier film may then be covered with a sacrificial cover film such as polypropylene (PP) routed from a sacrificial cover film roll 610, with the covered dielectric film structure collected on a collection roll 612. The collection roll 612 may collect a dielectric film structure such as the dielectric film structure 200, for example.

FIG. 7 schematically illustrates a tandem coating system 700 for fabricating a dielectric film structure such as the dielectric film structure 200, in accordance with various embodiments. The tandem coating system 700 may include a carrier film roll 702 that may hold a PET carrier film, for example. The carrier film may be routed past a first coat head 704 that may be used to deposit a low loss dielectric layer such as the second dielectric layer 206 onto the carrier film. The film may then be routed past a first dryer 708 to dry the low loss dielectric layer deposited by the first coat head 704. The film may then be routed past a second coat head 710 that may deposit a dielectric layer selected for laser drilling and smear removal, such as the first dielectric layer 204, onto the low loss dielectric layer. The carrier film with the two deposited layers may then be routed past a second dryer 712 to dry the dielectric layer applied by the second coat head 710. The dried dielectric layers and carrier film may then be covered with a sacrificial cover film (such as PP routed from a sacrificial cover film roll 714), with the covered dielectric film structure collected on a collection roll 716. The collection roll 716 may collect a dielectric film structure such as the dielectric film structure 200, for example.

FIG. 8 schematically illustrates a lamination system 800 for fabricating a dielectric film structure such as the dielectric film structure 200, in accordance with various embodiments. The lamination system 800 may include a top layer coating system 802 for depositing a low loss dielectric layer, a bottom layer coating system 804 for depositing a dielectric layer designed for laser drilling and smear removal, and a laminator 806 to laminate the dielectric layers together.

In some embodiments, the top layer coating system 802 may include a. first carrier film roll 808 that may hold a PET carrier film, for example. The carrier film may be routed past a first coat head 810 that may be used to deposit a low loss dielectric layer such as the second dielectric layer 206 onto the carrier film. The film may then be routed past a first dryer 812 to dry the low loss dielectric layer deposited by the first coat head 810. The carrier film with the dried low loss dielectric layer may then be covered with a sacrificial cover film such as PP routed from a first sacrificial film roll 814, with the covered low loss dielectric film structure collected on a first collection roll 816.

In some embodiments, the bottom layer coating system 804 may include a second carrier film roll 818 that may hold a PET carrier film, for example. The carrier film may be routed past a second coat head 820 that may be used to deposit a dielectric layer selected for laser drilling and smear removal, such as the first dielectric layer 204, onto the carrier film, The film may then be routed past a second dryer 822 to dry the dielectric layer deposited by the second coat head 820. The carrier film with the dried dielectric layer may then be covered with a sacrificial film such as PP routed from a second sacrificial film roll 824, with the covered dielectric film structure collected on a second collection roll 826.

In some embodiments, the laminator 806 may route a first dielectric film from a bottom layer roll 828 and a second dielectric film from a top layer roll 830 through a laminating device. The bottom layer roil 828 may include a dielectric film structure such as that collected on the second collection roll 826 and the top layer roll 830 may include a dielectric film structure such as that collected on the first collection roll 816, in various embodiments. The sacrificial film layers may be removed from the dielectric film layers before they are laminated together by the lamination device. In some embodiments, additional devices may facilitate removal of the carrier film from the bottom layer and application of a sacrificial cover film to the bottom layer before the laminated dielectric film structure is collected on a third collection roll 832. The third collection roll 832 may collect a dielectric film structure such as the dielectric film structure 200, for example.

Figure 9:
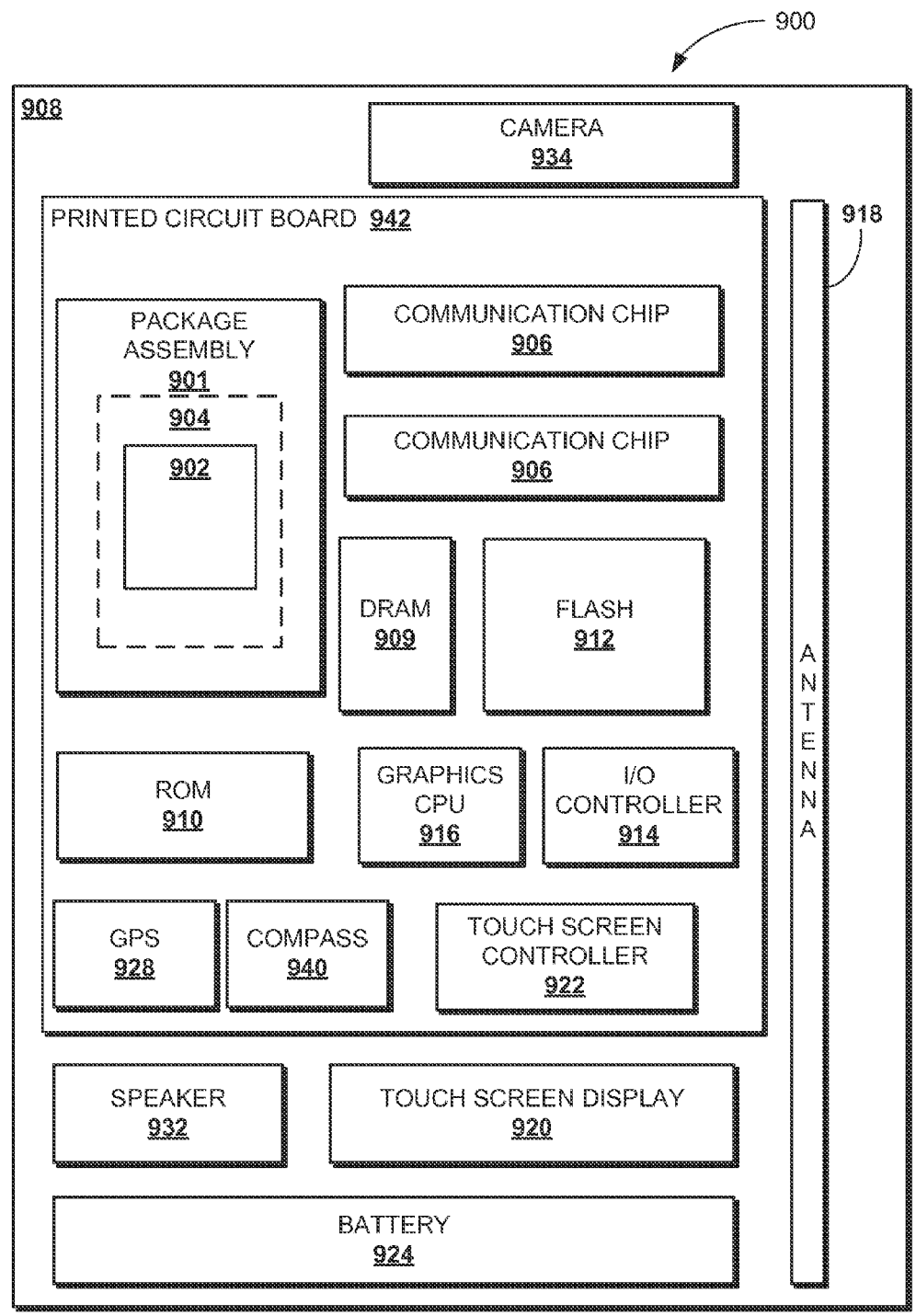
FIG. 9 schematically illustrates a computing device that includes a multi-layer package assembly having a bi-layer dielectric structure as described herein, in accordance with some embodiments.

Embodiments of the present disclosure may be implemented into a system using any suitable hardware and/or software to configure as desired. FIG. 9 schematically illustrates an example computing device 900 that includes a multi-layer package assembly 901 haying a bi-layer dielectric structure (e.g., package assembly 121, 308, 436, or 444 of FIG. 1, 3, or 4) as described herein, in accordance with some embodiments. The package assembly 901 may include a substrate 904 having a bi-layer dielectric structure such as the dielectric structure 202. The substrate 904 may be coupled with a die 902 that may be similar to the die 102 described with respect to FIG. 1, for example. In some embodiments, the die 902 may include a processor of the computing device 900. In some embodiments, the term "processor" may refer to any device or portion of a device that processes electronic data from registers and/or memory to transform that electronic data into other electronic data. that may be stored in registers and/or memory. The processor may include one or more processing cores in various embodiments.

In some embodiments, at least one communication chip 906 may be physically and electrically coupled with the package assembly 901. In some embodiments, the communication chip 906 may be a part of the package assembly 901 (e.g., as an additional die on or embedded in build-up layers in package assembly 901). In various embodiments, the computing device 900 may include a board such as a printed circuit board (PCB) 942 that may be in a housing 908 in some embodiments. In some embodiments, the board may be a motherboard. The package assembly 901 or the communication chip 906 may be disposed on the PCB 942 in some embodiments. Various components of the computing device 900 may be coupled with each other without employment of the PCB 942 in some embodiments.

Depending on its applications, the computing device 900 may include other components that may or may not be physically or electrically coupled with the PCB 942. These other components may include, but are not limited to, volatile memory (e.g., dynamic random access memory 909, also referred to as "DRAM"), non-volatile memory (e.g., read only memory 910, also referred to as "ROM"), flash memory 912, an input/output controller 914, a digital signal processor (not shown), a crypto processor (not shown), a graphics processor 916, one or more antenna 918, a display (not shown), a touch screen display 920, a touch screen controller 922, a battery 924, an audio codec (not shown), a video codec (not shown), a chipset (not shown), a. power amplifier (not shown), a global positioning system ("GPS") device 928, a compass 940, an accelerometer (not shown), a gyroscope (not shown), a speaker 932, a camera 934, or a mass storage device (such as hard disk drive, a solid state drive, compact disk (CD), digital versatile disk (DVD), and so forth) (not shown). In some embodiments, various components may be integrated with other components to form a system-on-chip ("SOC"). In some embodiments, some components, such as DRAM 909, may be embedded in the package assembly 901.

The communication chip 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN), The communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 906 may operate in accordance with other wireless protocols in other embodiments.

The computing device 900 may include a plurality of communication chips 906. For instance, a first communication chip 906 may be dedicated to shorter range wireless communications such as WiGig, Wi-Fi, and Bluetooth and a second communication chip 906 may be dedicated to longer range wireless communications such as GPS, EDGE, GPRS, CDMA, WiMAX, LTE, EV-DO, and others.

In various implementations, the computing device 900 may be a laptop, a netbook, a notebook, an ultrabook, smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 900 may be a mobile computing device in some embodiments. In further implementations, the computing device 900 may be any other electronic device that processes data.

EXAMPLES

Example 1 may include an integrated circuit (IC) package assembly comprising: a dielectric structure coupled with a metal layer, wherein the dielectric structure includes: a first dielectric layer having a first side and a second side opposite to the first side, wherein a distance between the first and second sides of the first dielectric layer defines a first thickness, and wherein the first dielectric layer has a first dielectric loss tangent; and a second dielectric layer having a first side and a second side opposite to the first side, wherein a distance between the first and second sides of the second dielectric layer defines a second thickness, and wherein the second dielectric layer has a second dielectric loss tangent, wherein the first side of the first dielectric layer is coupled with the second side of the second dielectric layer, the metal layer is coupled with the second side of the first dielectric layer, the first dielectric loss tangent is greater than the second dielectric loss tangent, and the first thickness is less than the second thickness.

Example 2 may include the subject matter of Example 1, wherein the first thickness is greater than or equal to 1 micron and less than or equal to 5 microns.

Example 3 may include the subject matter of any one of Examples 1-2, wherein: the first dielectric layer is formed of a first set of molecules and the second dielectric layer is formed of a second set of molecules; and molecules in the first set of molecules have a greater electric molecular dipole moment than molecules in the second set of molecules.

Example 4 may include the subject matter of any one of Examples 1-3, wherein the first dielectric layer has a dielectric loss tangent greater than 0.005 for operation in a range from greater than or equal to 1 gigahertz to less than or equal to 50 gigahertz.

Example 5 may include the subject matter of any one of Examples 1-4, wherein the second dielectric layer has a dielectric loss tangent less than 0.003 for operation in a range from greater than or equal to 1 gigahertz to less than or equal to 50 gigahertz.

Example 6 may include the subject matter of any one of Examples 1-5, further comprising a via structure extending through the first dielectric layer and the second dielectric layer of the dielectric structure.

Example 7 may include the subject matter of any one of Examples 1-6, wherein metal layer is a first metal layer, the IC package assembly further comprising a second metal layer having a first side coupled with the first side of the second dielectric layer.

Example 8 may include the subject matter of Example 7, wherein the dielectric structure is a first dielectric structure, the IC package assembly further comprising a second dielectric structure, wherein the second dielectric structure includes: a first dielectric layer having a first side and a second side opposite to the first side, wherein a distance between the first and second sides of the first dielectric layer of the second dielectric structure defines a first thickness, and wherein the first dielectric layer of the second dielectric structure has first dielectric loss tangent; and a second dielectric layer having a first side and a second side opposite to the first side, wherein a distance between the first and second sides of the second dielectric layer of the second dielectric structure defines a second thickness, and wherein the second dielectric layer of the second dielectric structure has a second dielectric loss tangent, wherein: the first side of the first dielectric layer of the second dielectric structure is coupled with the second side of the second dielectric layer of the second dielectric structure; the second side of the first dielectric layer of the second dielectric structure is coupled with a second side of the second metal layer; the first dielectric loss tangent of the second dielectric structure is greater than the second dielectric loss tangent of the second dielectric structure; and the first thickness of the second dielectric structure is less than the second thickness of the second dielectric structure.

Example 9 may include the subject matter of Example 8, wherein: the via structure is a first via structure extending through the first dielectric layer and the second dielectric layer of the first dielectric structure; and the IC package assembly further comprises a second via structure extending through the first dielectric layer and the second dielectric layer of the second dielectric structure.

Example 10 may include the subject matter of Example 9, wherein the first via structure is electrically coupled with the second via structure.

Example 11 may include a method of fabricating an integrated circuit (IC) package assembly, the method comprising: providing a dielectric structure including a first dielectric layer having a first side and a second side opposite to the first side, wherein the dielectric structure includes a second dielectric layer, the second dielectric layer having a first side and a second side opposite to the first side; and coupling a metal layer with the second side of the first dielectric layer, wherein: a distance between the first and second sides of the first dielectric layer defines a first thickness; the first dielectric layer has a first dielectric loss tangent; a distance between the first and second sides of the second dielectric layer defines a second thickness; the second dielectric layer has a second dielectric loss tangent; the first side of the first dielectric layer is coupled with the second side of the second dielectric layer; the first thickness is less than the second thickness; and the first dielectric loss tangent is greater than the second dielectric loss tangent.

Example 12 may include the subject matter of Example 11, wherein the first dielectric layer has a thickness between greater than or equal to 1 micron and less than or equal to 5 microns.

Example 13 may include the subject matter of any one of Examples 11-12, wherein: the first dielectric layer is formed of a first set of molecules; the second dielectric layer is formed of a second set of molecules; and molecules in the first set of molecules have a greater electric molecular dipole moment than molecules in the second set of molecules.

Example 14 may include the subject matter of any one of Examples 11-13, wherein the first dielectric layer has a dielectric loss tangent greater than 0.005 for operation in a range from greater than or equal to 1 gigahertz to less than or equal to 50 gigahertz.

Example 15 may include the subject matter of any one of Examples 11-14, wherein the second dielectric layer has a dielectric loss tangent less than 0.003 for operation in a range from greater than or equal to 1 to less than or equal to 50 gigahertz.

Example 16 may include the subject matter of any one of Examples 11-15, further comprising forming an opening for a via through the dielectric structure.

Example 17 may include the subject matter of Example 16, wherein forming an opening includes performing a laser drilling process.

Example 18 may include the subject matter of any one of Examples 16-17, further comprising desmearing the opening.

Example 19 may include the subject matter of any one of Examples 16-18, further comprising depositing a metal to fill the opening.

Example 20 may include the subject matter of Example 19, wherein the dielectric structure is a first dielectric structure, wherein the metal layer is a first metal layer, and the method further comprises: coupling a second metal layer with the second dielectric layer of the first dielectric structure; and coupling a first dielectric layer of a second dielectric structure with the second metal layer, wherein: the first dielectric layer of the second dielectric structure has a first side and a second side opposite to the first side; a distance between the first and second sides of the first dielectric layer of the second dielectric structure defines a first thickness: the first dielectric layer of the second dielectric structure has a first dielectric loss tangent; the second dielectric structure includes a second dielectric layer having a first side and a second side opposite to the first side; a distance between the first and second sides of the second dielectric layer of the second dielectric structure defines a second thickness; the second dielectric layer of the second dielectric structure has a second dielectric loss tangent; the first side of the first dielectric layer of the second dielectric structure is coupled with the second side of the second dielectric layer of the second dielectric structure; the second side of the first dielectric layer of the second dielectric structure is coupled with a second side of the second metal layer; the first dielectric loss tangent of the second dielectric structure is greater than the second dielectric loss tangent of the second dielectric structure; and the first thickness of the second dielectric structure is less than the second thickness of the second dielectric structure.

Example 21 may include a computing device comprising: a circuit board; and an integrated circuit (IC) package assembly coupled with the circuit board, the IC package assembly including: a dielectric structure coupled with a metal layer, wherein the dielectric structure includes: a first dielectric layer having a first side and a second side opposite to the first side, wherein a distance between the first and second sides of the first dielectric layer defines a first thickness, and wherein the first dielectric layer has a first dielectric loss tangent; and a second dielectric layer having a first side and a second side opposite to the first side, wherein a distance between the first and second sides of the second dielectric layer defines a second thickness, and wherein the second dielectric layer has a second dielectric loss tangent, wherein: the first side of the first dielectric layer is coupled with the second side of the second dielectric layer; the metal layer is coupled with the second side of the first dielectric layer; the first dielectric loss tangent is greater than the second dielectric loss tangent; and the first thickness is less than the second thickness.

Example 22 may include the subject matter of Example 20, wherein the first dielectric layer has a thickness between greater than or equal to 1 micron and less than or equal to 5 microns.

Example 23 may include the subject matter of any one of Examples 21-22, wherein: the first dielectric layer is formed of a first set of molecules and the second dielectric layer is formed of a second set of molecules; and molecules in the first set of molecules have a greater electric molecular dipole moment than molecules in the second set of molecules.

Example 24 may include the subject matter of any one of Examples 21-23, wherein the IC package assembly further includes a via structure extending though the first dielectric layer and the second dielectric layer of the dielectric structure.

Example 25 may include the subject matter of any one of Examples 21-24, wherein: the computing device is a mobile computing device including, coupled with the circuit board, a display, a touchscreen display, a touchscreen controller, a battery, a global positioning system device, a compass, a speaker, or a camera.

Example 26 may include a system for fabricating an integrated circuit (IC) package assembly, the system comprising: means for coupling a metal layer with a dielectric structure including a first dielectric layer having afloat side and a second side opposite to the first side; and means for forming an opening for a via through the dielectric structure, wherein: the dielectric structure includes a second dielectric layer, the second dielectric layer having a first side and a second side opposite to the first side; the means for coupling the metal layer is to couple the metal layer to the second side of the first dielectric layer; a distance between the first and second sides of the first dielectric layer defines a first thickness; the first dielectric layer has a first dielectric loss tangent; a distance between the first and second sides of the second dielectric layer defines a second thickness; the second dielectric layer has a second dielectric loss tangent; the first side of the first dielectric layer is coupled with the second side of the second dielectric layer; the first thickness is less than the second thickness; and the first dielectric loss tangent is greater than the second dielectric loss tangent.

Example 27 may include the subject matter of Example 26, wherein the first dielectric layer has a thickness between greater than or equal to 1 micron and less than or equal to 5 microns.

Example 28 may include the subject matter of any one of Examples 26-27, wherein: the first dielectric layer is formed of a first set of molecules; the second dielectric layer is formed of a second set of molecules; and molecules in the first set of molecules have a greater electric molecular dipole moment than molecules in the second set of molecules.

Example 29 may include the subject matter of any one of Examples 26-28, wherein the first dielectric layer has a dielectric loss tangent greater than 0.005 for operation in a range from greater than or equal to 1 gigahertz to less than or equal to 50 gigahertz.

Example 30 may include the subject matter of any one of Examples 26-29, wherein the second dielectric layer has a dielectric loss tangent less than 0.003 for operation in a range from greater than or equal to I to less than or equal to 50 gigahertz.

Example 31 may include the subject matter of any one of Examples 26-30, wherein forming an opening includes performing a laser drilling process.

Example 32 may include the subject matter of any one of Examples 26-31, further comprising means for desmearing the opening.

Example 33 may include the subject matter of any one of Examples 26-32, further comprising means for depositing a metal to fill the opening.

Example 34 may include the subject matter of Example 33, wherein the dielectric structure is a first dielectric structure, wherein the metal layer is a first metal layer, and the system further comprises: means for coupling a second metal layer with the second dielectric layer of the first dielectric structure; and means for coupling a first dielectric layer of a second dielectric structure with the second metal layer, wherein: the first dielectric layer of the second dielectric structure has a first side and a second side opposite to the first side; a distance between the first and second sides of the first dielectric layer of the second dielectric structure defines a first thickness; the first dielectric layer of the second dielectric structure has a first dielectric loss tangent; the second dielectric structure includes a second dielectric layer having a first side and a second side opposite to the first side; a distance between the first and second sides of the second dielectric layer of the second dielectric structure defines a second thickness; the second dielectric layer of the second dielectric structure has a second dielectric loss tangent; the first side of the first dielectric layer of the second dielectric structure is coupled with the second side of the second dielectric layer of the second dielectric structure; the second side of the first dielectric layer of the second dielectric structure is coupled with a second side of the second metal layer; the first dielectric loss tangent of the second dielectric structure is greater than the second dielectric loss tangent of the second dielectric structure; and the first thickness of the second dielectric structure is less than the second thickness of the second dielectric structure.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

What is claimed is:
1. An integrated circuit (IC) package assembly comprising:
 a dielectric structure coupled with a metal layer, wherein the dielectric structure includes:
  a first dielectric layer having a first side and a second side opposite to the first side, wherein a distance between the first and second sides of the first dielectric layer defines a first thickness, and wherein the first dielectric layer has a first dielectric loss tangent; and
  a second dielectric layer having a first side and a second side opposite to the first side, wherein a distance between the first and second sides of the second dielectric layer defines a second thickness, and wherein the second dielectric layer has a second dielectric loss tangent; and
 a solder mask layer coupled with the dielectric structure, wherein the first side of the first dielectric layer is directly coupled with the second side of the second dielectric layer, the metal layer is coupled with the second side of the first dielectric layer, the first dielectric loss tangent is greater than the second dielectric loss tangent, and the first thickness is less than the second thickness.

2. The IC package assembly of claim 1, wherein the first thickness is greater than or equal to 1 micron and less than or equal to 5 microns.

3. The IC package assembly of claim 1, wherein:
the first dielectric layer is formed of a first set of molecules and the second dielectric layer is formed of a second set of molecules; and
molecules in the first set of molecules have a greater electric molecular dipole moment than molecules in the second set of molecules.

4. The IC package assembly of claim 1, wherein the first dielectric layer has a dielectric loss tangent greater than 0.005 for operation in a range from greater than or equal to 1 gigahertz to less than or equal to 50 gigahertz.

5. The IC package assembly of claim 1, wherein the second dielectric layer has a dielectric loss tangent less than 0.003 for operation in a range from greater than or equal to 1 gigahertz to less than or equal to 50 gigahertz.

6. The IC package assembly of claim 1, further comprising a via structure extending through the first dielectric layer and the second dielectric layer of the dielectric structure.

7. The IC package assembly of claim 6, wherein the metal layer is a first metal layer, the IC package assembly further comprising a second metal layer having a first side coupled with the first side of the second dielectric layer.

8. The IC package assembly of claim 7, wherein the dielectric structure is a first dielectric structure, the IC package assembly further comprising a second dielectric structure, wherein the second dielectric structure includes:
a first dielectric layer having a first side and a second side opposite to the first side, wherein a distance between the first and second sides of the first dielectric layer of the second dielectric structure defines a first thickness, and wherein the first dielectric layer of the second dielectric structure has a first dielectric loss tangent; and
a second dielectric layer having a first side and a second side opposite to the first side, wherein a distance between the first and second sides of the second dielectric layer of the second dielectric structure defines a second thickness, and wherein the second dielectric layer of the second dielectric structure has a second dielectric loss tangent, wherein:
the first side of the first dielectric layer of the second dielectric structure is coupled with the second side of the second dielectric layer of the second dielectric structure;
the second side of the first dielectric layer of the second dielectric structure is coupled with a second side of the second metal layer;
the first dielectric loss tangent of the second dielectric structure is greater than the second dielectric loss tangent of the second dielectric structure; and
the first thickness of the second dielectric structure is less than the second thickness of the second dielectric structure.

9. The IC package assembly of claim 8, wherein:
the via structure is a first via structure extending through the first dielectric layer and the second dielectric layer of the first dielectric structure; and
the IC package assembly further comprises a second via structure extending through the first dielectric layer and the second dielectric layer of the second dielectric structure.

10. The IC package assembly of claim 9, wherein the first via structure is electrically coupled with the second via structure.

11. A method of fabricating an integrated circuit (IC) package assembly, the method comprising:
providing a dielectric structure including a first dielectric layer having a first side and a second side opposite to the first side, wherein the dielectric structure includes a second dielectric layer, the second dielectric layer having a first side and a second side opposite to the first side; and
coupling a metal layer of a metal covered core with the second side of the first dielectric layer, wherein:
a core layer of the metal covered core includes a dielectric material;
a distance between the first and second sides of the first dielectric layer defines a first thickness;
the first dielectric layer has a first dielectric loss tangent;
a distance between the first and second sides of the second dielectric layer defines a second thickness;
the second dielectric layer has a second dielectric loss tangent;
the first side of the first dielectric layer is coupled with the second side of the second dielectric layer;
the first thickness is less than the second thickness; and
the first dielectric loss tangent is greater than the second dielectric loss tangent.

12. The method of claim 11, wherein the first dielectric layer has a thickness between greater than or equal to 1 micron and less than or equal to 5 microns.

13. The method of claim 11, wherein:
the first dielectric layer is formed of a first set of molecules;
the second dielectric layer is formed of a second set of molecules; and
molecules in the first set of molecules have a greater electric molecular dipole moment than molecules in the second set of molecules.

14. The method of claim 11, wherein the first dielectric layer has a dielectric loss tangent greater than 0.005 for operation in a range from greater than or equal to 1 gigahertz to less than or equal to 50 gigahertz.

15. The method of claim 11, wherein the second dielectric layer has a dielectric loss tangent less than 0.003 for operation in a range from greater than or equal to 1 to less than or equal to 50 gigahertz.

16. The method of claim 11, further comprising forming an opening for a via through the dielectric structure.

17. The method of claim 16, wherein forming an opening includes performing a laser drilling process.

18. The method of claim 16, further comprising desmearing the opening.

19. The method of claim 16, further comprising depositing a metal to fill the opening.

20. The method of claim 19, wherein the dielectric structure is a first dielectric structure, wherein the metal layer is a first metal layer, and the method further comprises:
coupling a second metal layer with the second dielectric layer of the first dielectric structure; and
coupling a first dielectric layer of a second dielectric structure with the second metal layer, wherein:
the first dielectric layer of the second dielectric structure has a first side and a second side opposite to the first side;
a distance between the first and second sides of the first dielectric layer of the second dielectric structure defines a first thickness;

the first dielectric layer of the second dielectric structure has a first dielectric loss tangent;

the second dielectric structure includes a second dielectric layer having a first side and a second side opposite to the first side;

a distance between the first and second sides of the second dielectric layer of the second dielectric structure defines a second thickness;

the second dielectric layer of the second dielectric structure has a second dielectric loss tangent;

the first side of the first dielectric layer of the second dielectric structure is coupled with the second side of the second dielectric layer of the second dielectric structure;

the second side of the first dielectric layer of the second dielectric structure is coupled with a second side of the second metal layer;

the first dielectric loss tangent of the second dielectric structure is greater than the second dielectric loss tangent of the second dielectric structure; and the first thickness of the second dielectric structure is less than the second thickness of the second dielectric structure.

21. A computing device comprising:

a circuit board;

a die;

an integrated circuit (IC) package assembly including a first side coupled with the circuit board and a second side opposite the first side coupled with the die, the IC package assembly including:

a dielectric structure coupled with a metal layer, wherein the dielectric structure includes:

a first dielectric layer having a first side and a second side opposite to the first side, wherein a distance between the first and second sides of the first dielectric layer defines a first thickness, and wherein the first dielectric layer has a first dielectric loss tangent; and a second dielectric layer having a first side and a second side opposite to the first side, wherein a distance between the first and second sides of the second dielectric layer defines a second thickness, and wherein the second dielectric layer has a second dielectric loss tangent, wherein:

the first side of the first dielectric layer is coupled with the second side of the second dielectric layer;

the metal layer is coupled with the second side of the first dielectric layer;

the first dielectric loss tangent is greater than the second dielectric loss tangent; and the first thickness is less than the second thickness.

22. The computing device of claim 21, wherein the first dielectric layer has a thickness between greater than or equal to 1 micron and less than or equal to 5 microns.

23. The computing device of claim 21, wherein:

the first dielectric layer is formed of a first set of molecules and the second dielectric layer is formed of a second set of molecules; and molecules in the first set of molecules have a greater electric molecular dipole moment than molecules in the second set of molecules.

24. The computing device of claim 21, wherein the IC package assembly further includes a via structure extending through the first dielectric layer and the second dielectric layer of the dielectric structure.

25. The computing device of claim 21, wherein:

the computing device is a mobile computing device including, coupled with the circuit board, a display, a touchscreen display, a touchscreen controller, a battery, a global positioning system device, a compass, a speaker, or a camera.

* * * * *